(12) United States Patent
Norris et al.

(10) Patent No.: US 7,279,703 B2
(45) Date of Patent: Oct. 9, 2007

(54) SELF-HEATING BURN-IN

(75) Inventors: Jeffrey M. Norris, Placerville, CA (US); Richard E. Silveria, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 652 days.

(21) Appl. No.: 10/642,382

(22) Filed: Aug. 14, 2003

(65) Prior Publication Data
US 2005/0036352 A1 Feb. 17, 2005

(51) Int. Cl.
H01L 29/08 (2006.01)
(52) U.S. Cl. .................. 257/40; 365/201; 714/718; 714/724; 324/765; 257/E21.521
(58) Field of Classification Search .............. 257/40, 257/E21.521; 365/201; 714/718, 724; 324/765
See application file for complete search history.

(56) References Cited

U.S. PATENT DOCUMENTS

| | | | |
|---|---|---|---|
| 5,498,971 A | 3/1996 | Turnbull et al. | |
| 5,982,198 A | 11/1999 | Fulkerson | |
| 6,037,792 A * | 3/2000 | McClure | 324/760 |
| 6,285,610 B1 * | 9/2001 | Chun | 365/201 |
| 6,486,450 B1 | 11/2002 | Quinlan et al. | |
| 6,546,510 B1 * | 4/2003 | Mazumder et al. | 714/718 |
| 6,562,636 B1 * | 5/2003 | Richmond et al. | 438/14 |
| 2004/0051558 A1 * | 3/2004 | Keshavarzi et al. | 326/93 |

OTHER PUBLICATIONS

PCT International Search Report (P17497PCT), International Application No. PCT/US2004/025439, Apr. 21, 2005, 7 pages.

* cited by examiner

Primary Examiner—Eugene Lee
(74) Attorney, Agent, or Firm—Philip A. Pedigo

(57) ABSTRACT

A method and an apparatus for self-heating burn-in have been disclosed. In one embodiment, a semiconductor device includes a plurality of gates, a multiplexer to select a clock signal out of a plurality of clock signals to toggle the plurality of gates in response to the selected clock signal to generate heat internally for burn-in, and a thermal sensing circuitry to monitor an internal temperature.

4 Claims, 17 Drawing Sheets

SELF-HEATING BURN-IN

FIELD OF INVENTION

The present invention relates to semiconductor technology, and more particularly, to burn-in of semiconductor devices.

BACKGROUND

Burn-in of semiconductor devices is the acceleration of the life of the semiconductor devices using various combinations of voltage, temperature, and time. Burn-in predicts different quality levels of the semiconductor devices associated with time. Semiconductor manufacturers typically use burn-in to estimate the lifetime of semiconductor devices. In addition, burn-in is also a quality measure to estimate the number and/or the type of defects in the semiconductor devices over time. Burn-in is also used to accelerate a device past infant mortality. Infant mortality is an initial phase of device life. A device with a short life usually fails early in its life during the phase of infant mortality. Once a device has passed this initial phase of life, the device is more likely to function for many more years.

To burn-in a device, the device is usually loaded into a socket on a burn-in board (BIB). The BIB is the large circuit board used to hold and route signal traces for all of the devices undergoing burn-in. The BIB typically has a number of sockets to accommodate multiple devices. The devices are plugged into the sockets on the BIB, which is transferred into an oven for burn-in.

A driver for supplying the device stimulus and monitoring the device during burn-in is mounted at the back of the oven and coupled to the BIB after the BIB is loaded into the oven. An example of the driver is a Universal Burn-In Driver (UBID). Before burn-in, the oven temperature is ramped up to the desired level, which usually takes approximately 25 minutes. During burn-in, the device stimulus from the driver toggles as many gates in the device as possible. After burn-in, the oven is cooled down, which takes approximately another 25 minutes, before an operator can safely remove the BIB from the oven.

Currently, burn-in for chipset devices uses an expensive older generation Criteria 18 oven to control the junction temperature of the devices. The temperature range of Criteria 18 oven is limited. To burn in a chipset device at a temperature below the lower limit of the temperature range of Criteria 18 oven, an expensive heat sink is installed on the socket with each chipset device on the BIB to lower the temperature of the individual device to the desired burn-in temperature. Moreover, Criteria 18 oven has to operate at a high ambient temperature to be stable. Therefore, the interior temperature of the test floor has to be continuously monitored.

To control the oven and the driver, the current technology uses an external computer system. The computer system loads one or more burn-in patterns into the driver before burn-in. It usually takes 20-25 minutes to load the patterns. During burn-in, the driver uses the patterns to control the device to execute different tests.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

FIG. 4C shows the device temperature and power consumption of one embodiment of a device running self-heating burn-in.

DETAILED DESCRIPTION

Overview

Figure 1A:
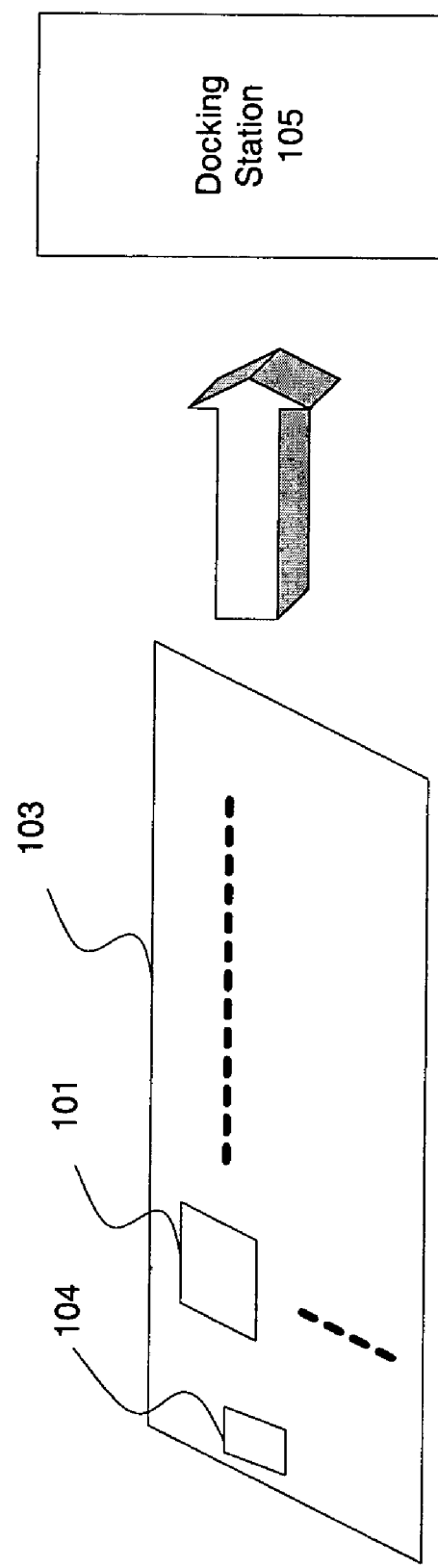
FIG. 1A shows an embodiment of a device loaded on a BIB to be transferred into an embodiment of a docking station.

FIG. 1A shows one embodiment of running self-heating burn-in. The device 101 includes a thermal sensor and various circuitries to generate heat and to regulate the internal junction temperature during burn-in. The circuitries are also referred to as Design for Testing (DFT). Referring to FIG. 1A, the device 101 is loaded onto a burn-in board (BIB) 103. The BIB 103 is then loaded into a docking station 105 for burn-in. In one embodiment, a driver card 104 is mounted onto the BIB 103 to provide the device 101 with phase-shifted clock signals and signals in a test mode entry sequence to cause the device 101 to start running burn-in.

Besides generating heat, in one embodiment, the device includes a state machine to run various tests during burn-in. As a result, an external computer system for controlling the oven and a driver are no longer needed. Moreover, it is no longer necessary to load burn-in patterns to the driver. Eliminating the external computer system and the driver saves time and cost of burn-in.

Enabling the device to generate heat during burn-in eliminates the oven, and hence, presents great opportunities for saving cost and time. First, eliminating the oven saves the cost in purchasing and maintaining the oven. Furthermore, burn-in time is reduced because it is no longer necessary to preheat the oven before burn-in or to cool down the oven after burn-in. In addition to test time reduction, the procedures to implement burn-in in factories are simplified by eliminating the oven. Moreover, removing the bulky ovens also saves factory space to allow more devices to undergo burn-in at the same time.

Also, the device no longer needs a heat sink to prevent overheating due to the internal on-die circuits, which replaces the oven, and thus, further reduces the burn-in cost. Another benefit of on-die temperature regulation is to prevent process variation among the devices to affect burn-in as each device regulates its own internal temperature independent of other devices.

To illustrate the technologies and concepts, various embodiments of the docking station, the device with DFT, and the driver card are described in greater details below. In the following description, numerous specific details are set forth. However, it is understood that embodiments of the invention may be practiced without these specific details. In other instances, well-known circuits, structures, and techniques have not been shown in detail in order not to obscure the understanding of this description.

Docking Station

Figure 1B:
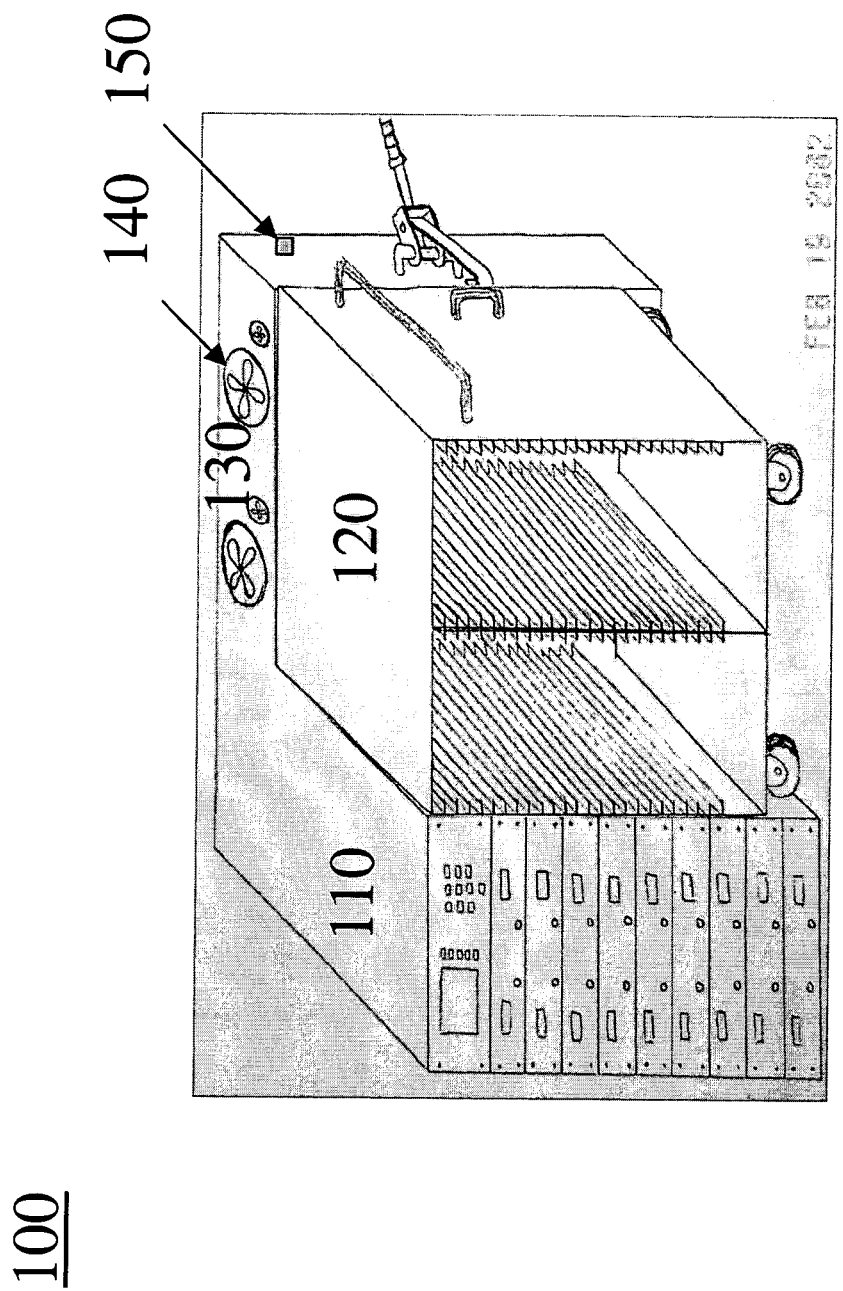
FIG. 1B shows one embodiment of a docking station.

FIG. 1B shows an embodiment of a docking station 100. The docking station 100 includes a power supply rack 110, a cart 120, a housing 130, one or more exhaust fans 140, and a thermostat 150. In one embodiment, the power supply rack 110 holds a number of voltage supplies to provide voltage (e.g., Vcc) to the devices during burn-in. The voltage supplied varies in different embodiments, for example, 2.85V, 5.00V, etc. BIBs (not shown) with devices are loaded into the cart 120. In one embodiment, the cart 120 is a roll-around cart for ease of handling. In one embodiment, the cart 120 is detachably secured to the housing 130 and/or the power supply rack 110 so that the BIBs inside the cart 120 can be coupled to the power supplies via a buss-bar backplane inside the housing 130. The cables inside the housing 130 distribute power to the BIBs.

Referring to FIG. 1B, exhaust fans 140 are installed in the housing 130. In one embodiment, the housing 130 includes a thermostat 150 to monitor the temperature of the docking station 100. In one embodiment, the thermostat 150 includes a thermocouple. In an alternate embodiment, the thermostat includes a resistive thermal device (RTD). When the temperature of the docking station exceeds a pre-determined trip point, one or more of the exhaust fans 140 would be turned on to cool down the station 100. In one embodiment, a small fan is always on to draw a small amount of air across all of the BIBs. When the temperature exceeds a pre-programmed trip point, one or more larger fans are turned on until the temperature of the station 100 cools down to below the trip point. In one embodiment, the ambient temperature of the docking station 100 is maintained below 35° C. In other embodiments, the docking station may be maintained below another temperature, depending on the specification of the devices undergoing burn-in.

Figure 2:
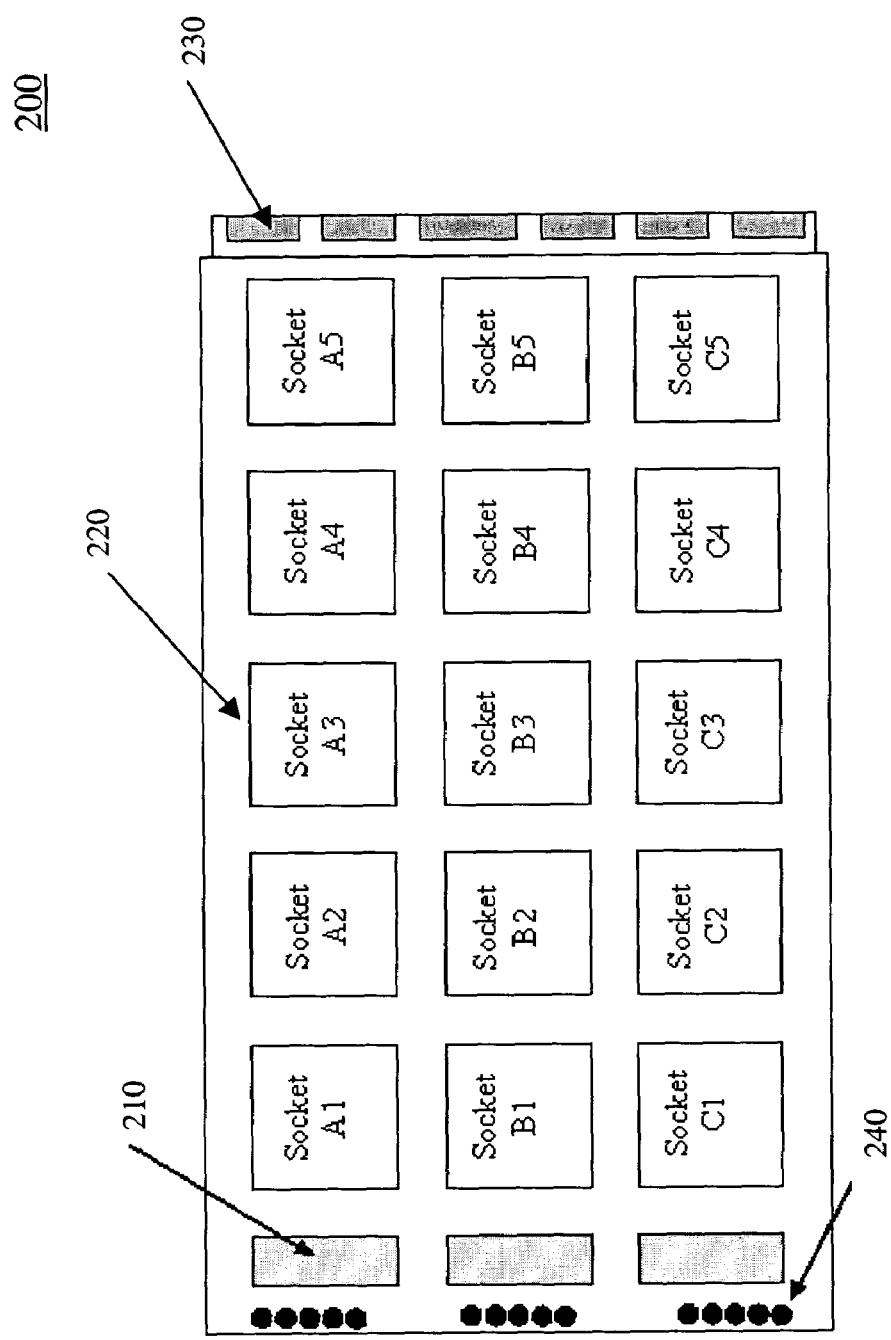
FIG. 2 shows one embodiment of a BIB.

FIG. 2 shows one embodiment of a BIB 200. The BIB 200 includes 3 driver cards 210, 15 sockets 220, 6 power tabs 230, and 15 light emitting diodes (LED) 240. To burn-in a device, the device is mounted into one of the sockets 220. In one embodiment, 3 driver cards 210 are mounted onto the BIB 200 to provide signals in a test mode entry sequence and clock signals to the devices under burn-in. The power tabs 230 are coupled to buss-bar power clips (not shown) when the BIB 200 is loaded into the cart 120, which is secured to the housing 130 and/or the power supply rack 110 of the docking station 100. In one embodiment, the BIB 200 includes a LED 240 for each socket 220. A device undergoing burn-in in the socket 220 drives the LED 240 such that the LED 240 flashes if the device is running properly. More details on the device are provided in the following section.

Figure 3:
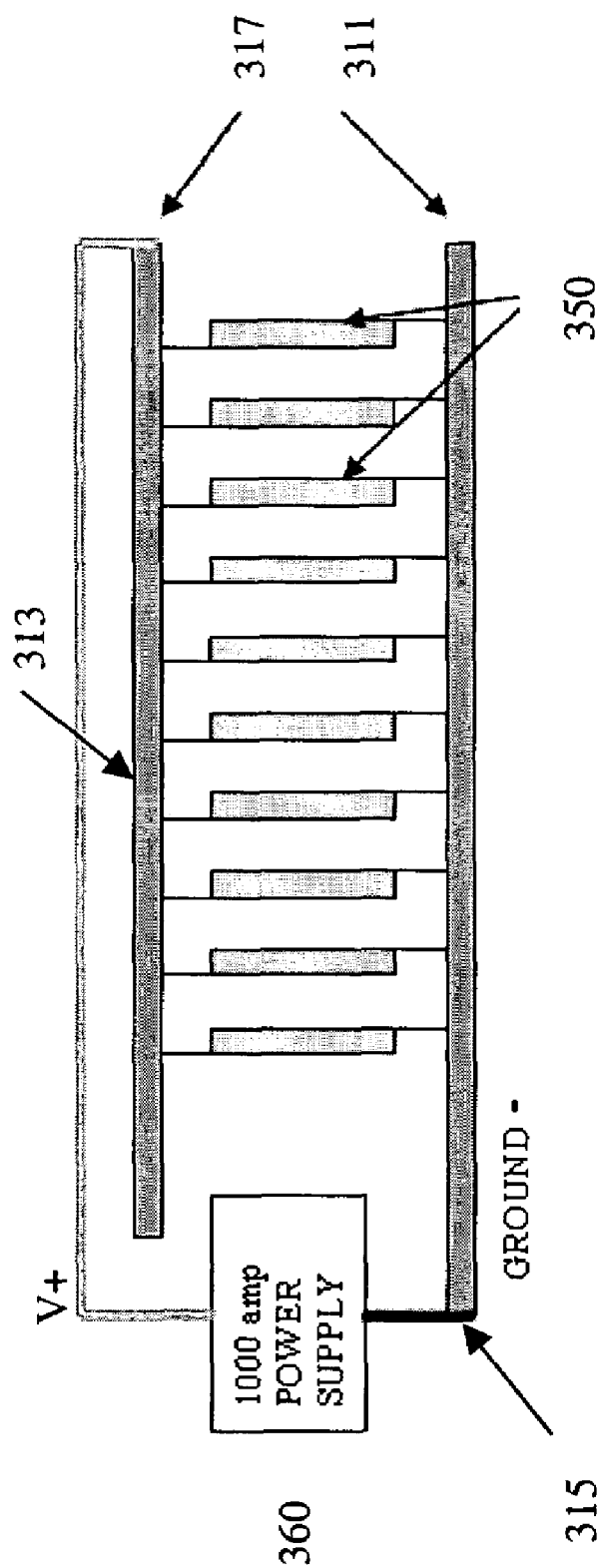
FIG. 3 shows one embodiment of a pair of buss-bars.

FIG. 3 shows one embodiment of a pair of buss-bars 311 and 313. In one embodiment, the buss-bars 310 are mounted on two steel rods welded across the main structural frame of the docking station. In one embodiment, the rods are 1"×2"×⅛" thick steel square tubing. Insulators are mounted between the buss-bars and the rods. In one embodiment, the insulators are custom made from Teflon.

The buss-bars support a number of BIBs 350. The buss-bars may be configured to support 12-48 BIBs. In one embodiment, the buss bars are made of 2"×¾" solid aluminum bars. However, it should be apparent that alternate embodiments may include frames and/or buss-bars made of different materials and/or dimensions. Referring to FIG. 3, the buss-bars 311 and 313 include a ground buss-bar 311 and a power supply buss-bar 313. A power cable connection point is provided at one end of each buss-bar. The cable connection point 315 for the ground buss-bar 311 is near the bottom of the ground buss-bar 311, while the cable connection point 317 for power supply 360 is near the top of the power supply buss-bar 313. In one embodiment, a current as high as 1000 Amps from the power supply 360 runs across the buss-bars and the buss-bars are modeled as a resistor. By coupling the cables at opposing ends of the buss-bars 311 and 313, the absolute voltage present at each BIB is more consistent. In an alternate embodiment, both cables are attached to the buss-bars near the same end, and therefore, the voltage across the BIB closest to the cable connection points would be higher than the voltage across the BIB farthest from the cable connection points.

To prevent dust accumulation and shorting of the buss-bars, one embodiment of the buss-bar structure is covered with a shield. In one embodiment, the shield is a plastic sheet with slots to allow insertion of the BIBs. However, it should be apparent that the shield can be made of any electrically non-conductive material. In one embodiment, an opening in between each buss-bar set allows hot air to be pulled across the BIBs and exhausted out through the top of the housing of the docking station.

DFT in the Semiconductor Device

Figure 4A:
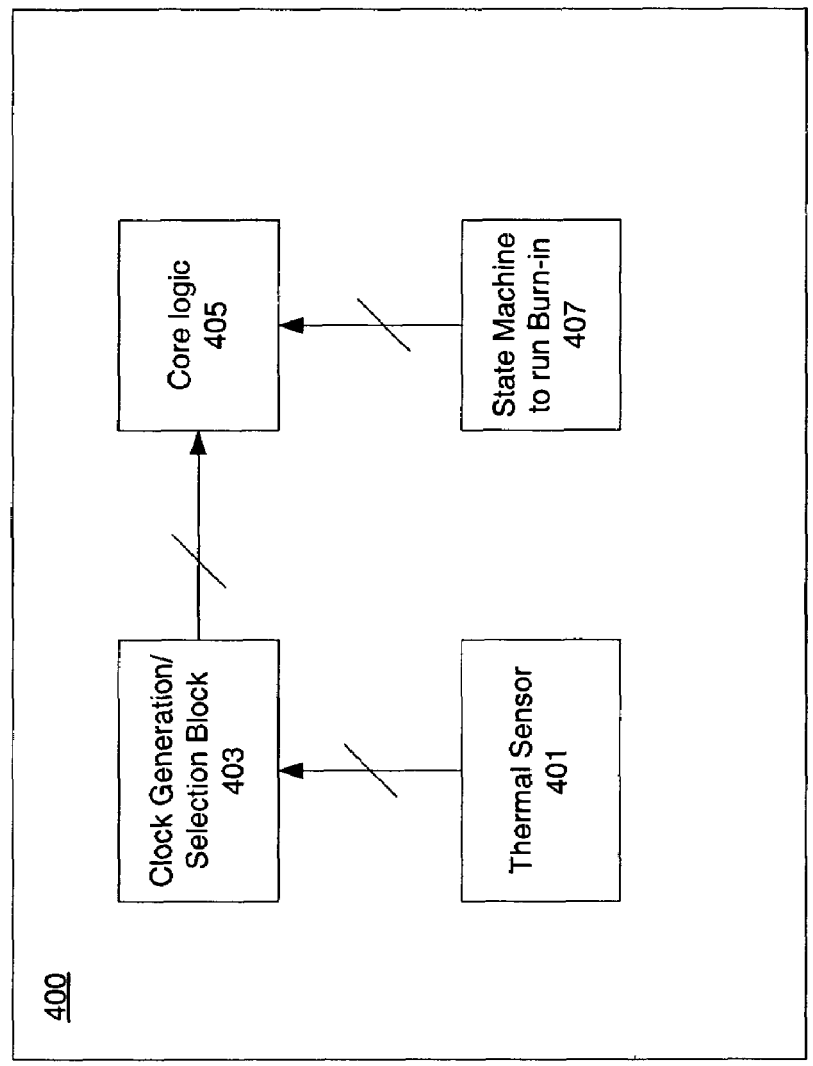
FIG. 4A shows one embodiment of a device.

FIG. 4A shows one embodiment of a semiconductor device 400. The semiconductor device 400 may comprise a processor, a memory controller hub, a memory, a graphics chip, etc. Referring to FIG. 4A, the device 400 includes a thermal sensor 401, a clock generation and selection block 403, core logic 405, and a state machine 407. The thermal sensor 401 detects the internal temperature of the device. Based on the internal temperature, the thermal sensor 401 sends one or more signals to the clock generation and selection block 403 to select a clock signal at an appropriate frequency. The core logic 405 receives the selected clock signal and operates at the frequency of the selected clock signal. The state machine 407 controls the core logic 405 during burn-in to run various test modes.

Figure 4B:
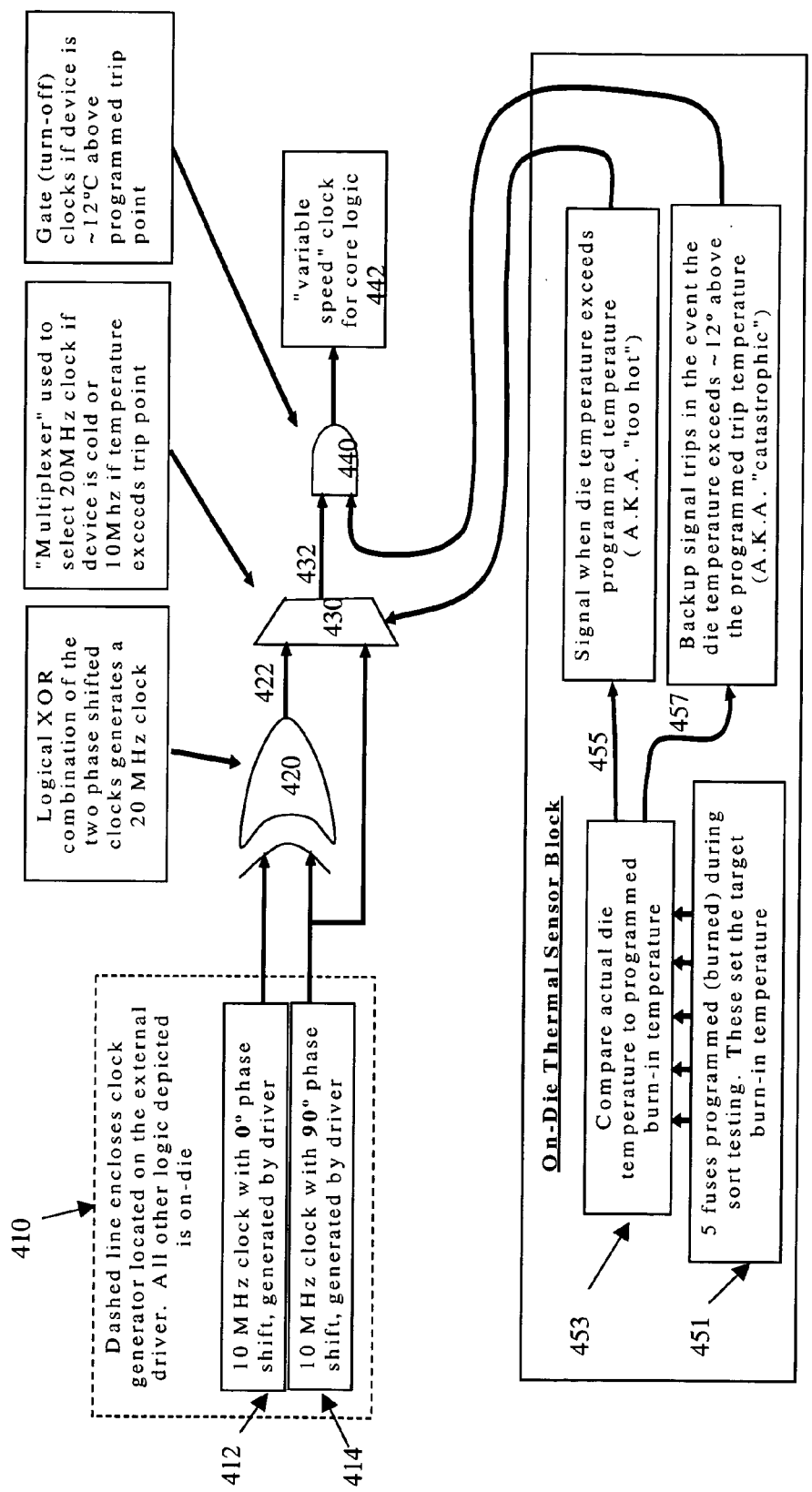
FIG. 4B shows one embodiment of a self-heating burn-in on-die temperature control circuitry of a device.

FIG. 4B shows one embodiment of a self-heating burn-in on-die temperature control circuitry in a device. In one embodiment, the circuitry is part of the DFT in the semiconductor device. The self-heating burn-in on-die temperature control circuitry includes an exclusive OR (XOR) gate 420, a multiplexer 430, an AND gate 440, a number of fuses 451, and an on-die thermal sensor 453. The XOR gate 420 receives two phase-shifted clock signals from an external driver 410. In one embodiment, the clock signals include a 10 MHz clock signal 412 and a 10 MHz clock signal 414 with 90° phase shift relative to the clock signal 412. Depending on the target burn-in temperature and time, clock signals at different frequencies can be used in other embodiments.

Using the two phase-shifted clock signals 412 and 414, the XOR gate 420 outputs a clock signal 422 with a frequency twice the frequency of the input clock signals 412 and 414. For example, in one embodiment, if the input clock signals 412 and 414 are at 10 MHz with 90° phase shift, then the output clock signal 422 from the XOR gate 420 is at 20 MHz. The clock signal 422 and the clock signal 414 are both input to the multiplexer 430. The multiplexer 430 selects a clock signal out of the two input clock signals 414 and 422 in response to the signal 455 from the on-die thermal sensor block 453. In an alternate embodiment, more than two clock signals at different frequencies are input to the multiplexer 430 for the device to select from.

In one embodiment, there are 5 programmable fuses 451 coupled to the thermal sensor 453. The fuses 451 are programmable to different temperature levels. The fuses 451 may be programmed during wafer level sort testing of the semiconductor devices to set a target burn-in temperature. In one embodiment, the target burn-in temperature is 91° C. However, one should appreciate that the target burn-in temperature varies in different embodiments, depending on a variety of factors, such as, for example, the process, the burn-in time, etc. Furthermore, the device may include additional fuses that are programmed at more than one temperature levels.

In one embodiment, the fuses 451 provide the programmed target burn-in temperature to the thermal sensor 453. The thermal sensor 453 senses the internal temperature of the device and compares the temperature to the programmed target burn-in temperature. In response to the comparison, the thermal sensor 453 generates a number of output signals. In one embodiment, the output signals include a signal 455, which is also referred to as "too hot," to indicate whether the temperature exceeds the target temperature. In one embodiment, the thermal sensor 453 further generates a backup signal 457 that trips in the event the temperature exceeds the target temperature by a certain amount. In one embodiment, the signal 457 trips when the internal temperature exceeds the target temperature by 12° C. or more. The signal 457 may also be referred to as "catastrophic." It should be apparent to one of ordinary skill in the art that the thermal sensor 453 can generate additional output signals to indicate various temperature levels based on the comparison of the actual temperature of the die and the programmed temperature from the fuses 451.

In one embodiment, the signal 455, also known as "too hot," is provided to the multiplexer 430 to select a clock signal. When the internal temperature is below the target temperature, the device has to run at a higher frequency to generate more heat in order to raise the internal temperature to the target temperature. Likewise, when the internal temperature is above the target temperature, the device has to run at a lower frequency to generate less heat. For example, in one embodiment, the multiplexer 430 selects the 10 MHz clock signal 414 when the signal 455 indicates the die temperature exceeds the target temperature, and the multiplexer 430 selects the 20 MHz clock signal 422 when the signal 455 indicates otherwise. The selected clock signal 432 from the multiplexer 430 and the other output signal 457 from the thermal sensor 453 are input to the AND gate 440.

Figure 4C:
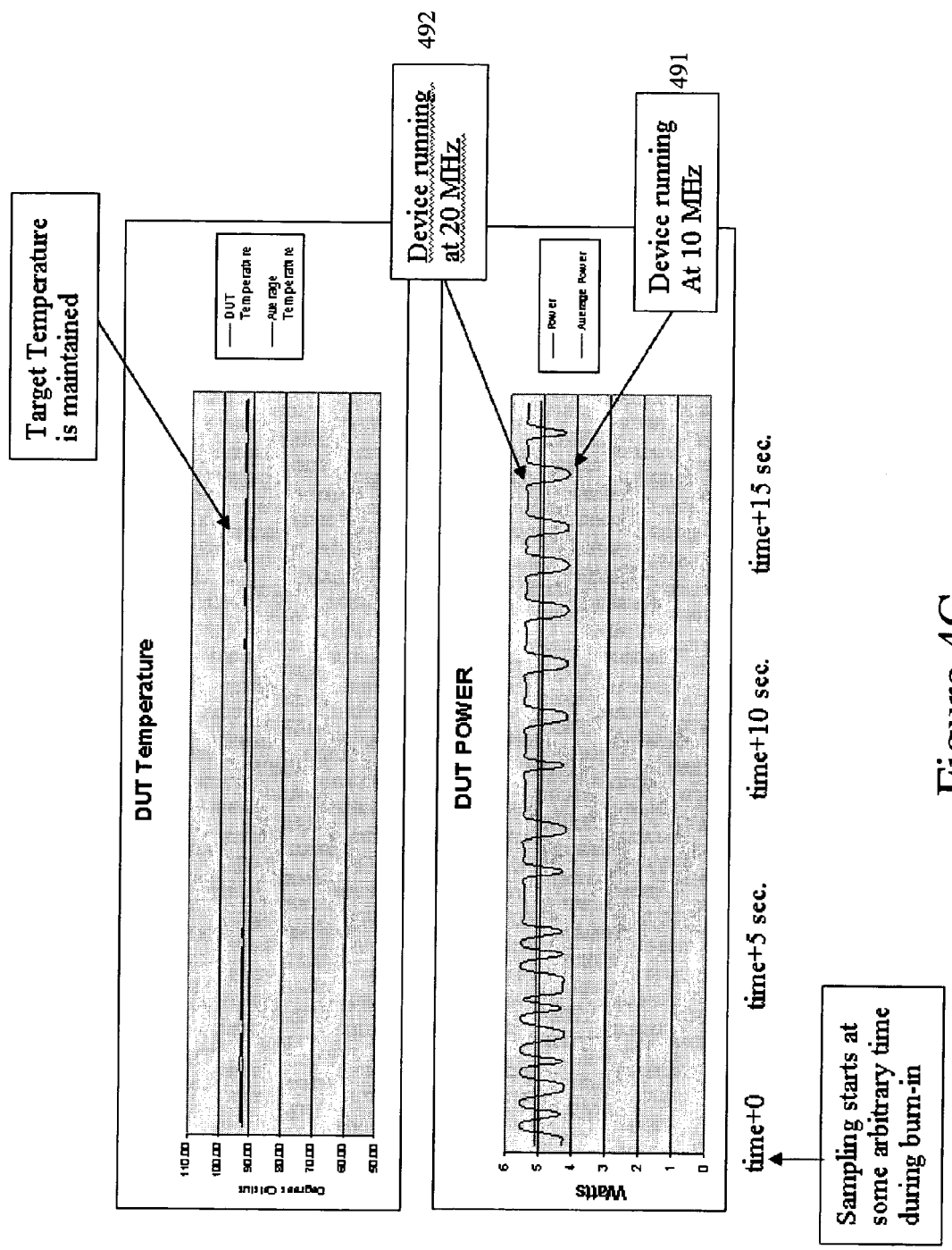

By regulating the clock frequency based on the internal temperature of each individual device, the internal temperature is maintained to be substantially constant independent of other devices undergoing burn-in simultaneously. Likewise, the average power of the device is also maintained to be substantially constant. FIG. 4C shows the device temperature and power consumption measured in an exemplary device. The average device temperature is substantially at the target temperature, which is about 92.5° C., and the average power is about 5.12 Watts. The higher the device frequency is, the more power is generated. For example, referring to FIG. 4C, the device power is approximately 4.2 Watts when the device is running at 10 MHz at 491. The device power is approximately 5.5 Watts when the device is running at 20 MHz at 492. One should appreciate that the measurements are provided here for illustration only. Different embodiments have various device temperature and power consumption.

In one embodiment, the gate 440 passes the selected clock signal 432 when the signal 457 is "1." When the signal 457 is "0," the gate 440 blocks off the clock signal 432 and essentially shuts off the device to allow the device to cool down. As the device starts to cool down below the preprogrammed "catastrophic" set point, the thermal sensor will turn the signal 457 to "1" to allow the gate 440 to pass the clock signal 432. The device will, therefore, start to run again using the clock signal 432. The output 442 of the gate 440 is essentially an internal temperature sensitive variable speed clock signal for the core logic (not shown) of the device.

Figure 5:
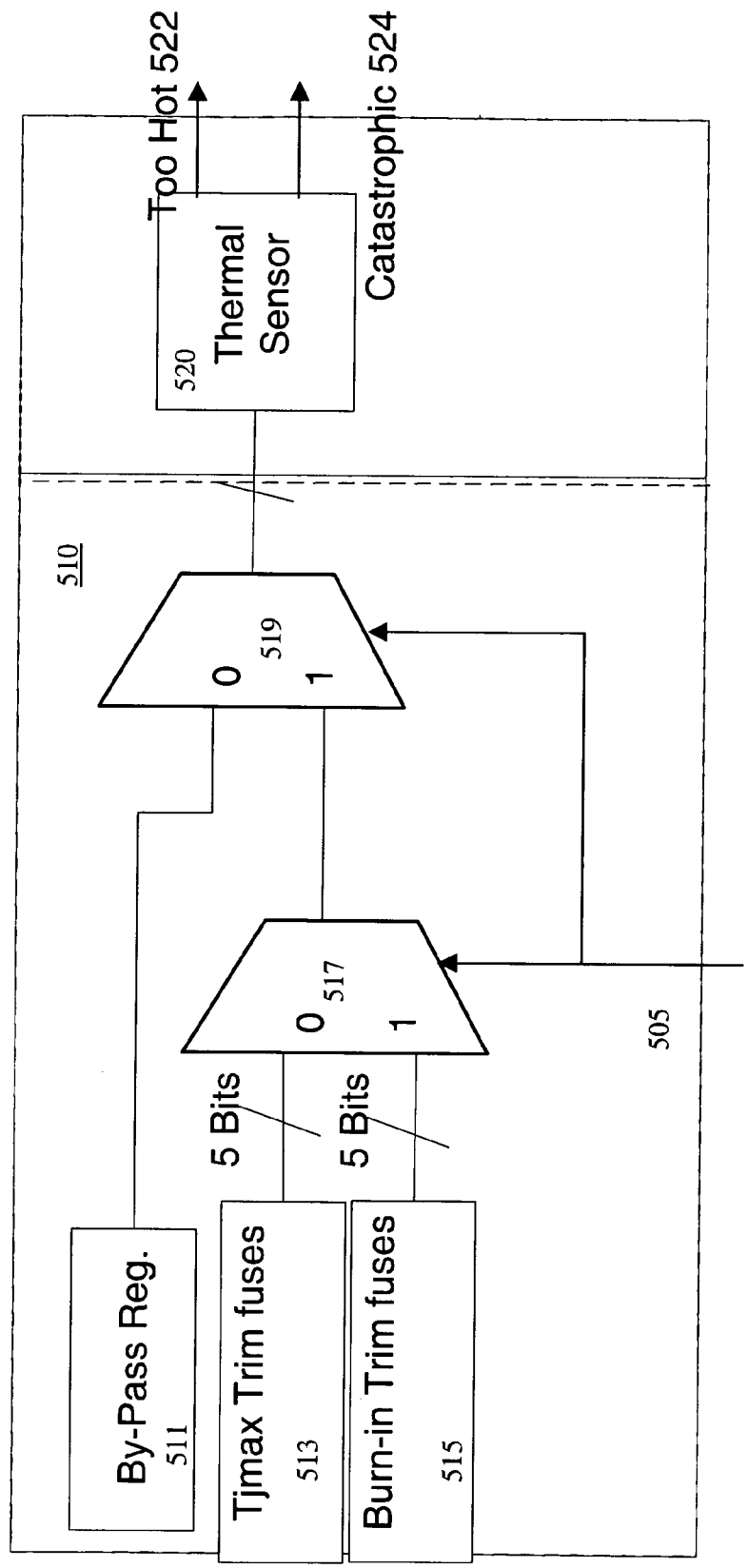
FIG. 5 shows one embodiment of the thermal sensor block.

FIG. 5 shows one embodiment of the thermal sensor in a device. The thermal sensor 520 is coupled to a fuse block 510. The fuse block 510 includes a by-pass register 511, a number of maximum junction temperature (Tjmax) trim fuses 513, a number of burn-in trim fuses 515, and two multiplexers 517 and 519. The fuse block 510 receives a signal 505, which indicates that the device is or is not in self-heating burn-in mode. In one embodiment, the signal 505 is generated by test mode logic (not shown) of the device upon receiving one or more input signals in a predetermined sequence from a driver card (not shown). The driver card will be discussed in more details in the following section.

In one embodiment, each of the two groups of fuses 513 and 515 includes 5 fuses. However, it should be apparent to one of ordinary skill in the art that other embodiments may include different numbers of fuses. Each group can be programmed to a particular temperature set point. The temperature set point of the burn-in trim fuses is the target burn-in temperature. For example, in one embodiment, the burn-in trim fuses 515 are programmed to 91° C. The multiplexer 517 selects the burn-in trim fuses 515 when the signal 505 indicates that the device is in burn-in mode. Otherwise, the multiplexer 517 selects the Tjmax trim fuses 513. The selected temperature set point is input to the multiplexer 519. In one embodiment, the signal 505 from the test mode logic also controls the multiplexer 519 such that the multiplexer 519 selects the output of multiplexer 517 when the device is in a burn-in mode. Otherwise, the multiplexer 519 selects the content of the by-pass register 511. The output of the multiplexer 519 is input to the thermal sensor 520.

The thermal sensor 520 senses the die temperature and compares the die temperature with the selected temperature set point from the multiplexer 519. Based on the comparison, the thermal sensor 520 generates two signals 522 and 524 in one embodiment. The signal 522, also known as "too hot," indicates that the die temperature exceeds the selected set point from the multiplexer 519. The signal 524, also known as "catastrophic," indicates that the die temperature exceeds the selected set point by a certain amount or more. For example, in one embodiment, the signal 524 indicates that the die temperature exceeds the burn-in set point by 12° C. or more. In one embodiment, the signals 522 and 524 are forwarded to the multiplexer 430 and the gate 440 as shown in FIG. 4B to select a clock signal with the appropriate frequency.

Figure 6:
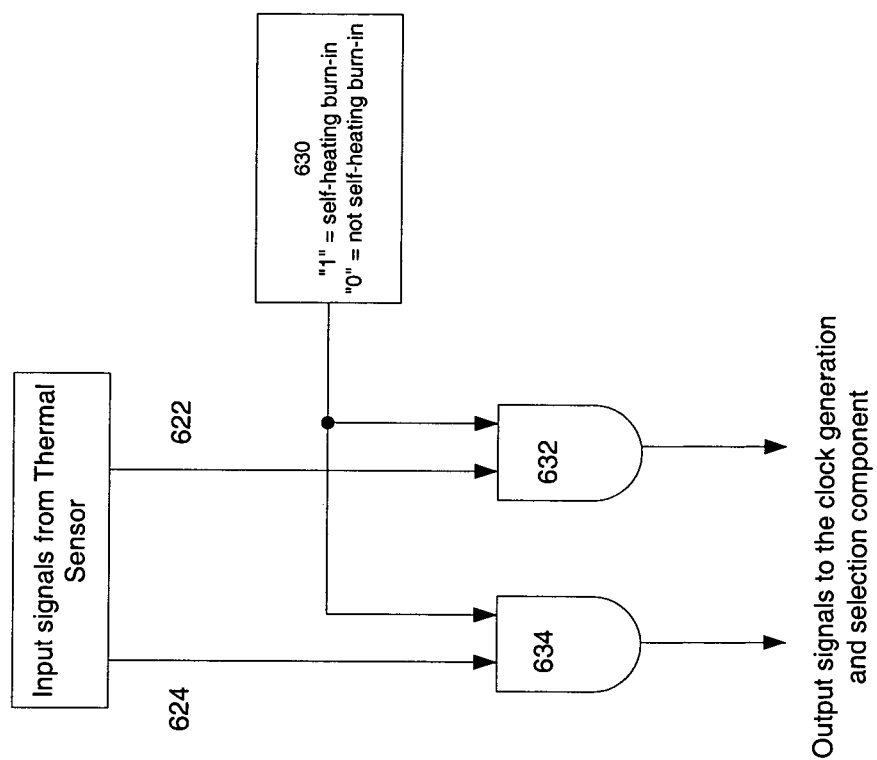
FIG. 6 shows one embodiment of clock signal gating circuitry.

Referring to FIG. 6, in one embodiment, the signals 622 and 624 from the thermal sensor 520 (shown in FIG. 5) are routed through two gates 632 and 634 respectively. The outputs of the gates 632 and 634 are forwarded to the clock generation and selection block (not shown) to select a clock signal with an appropriate frequency based on the die temperature in one embodiment. In one embodiment, the gates 632 and 634 receive an input signal 630 to indicate whether the device is in self-heating burn-in mode. In one embodiment, the signal 630 is 0 when the device is not in self-heating burn-in mode, and therefore, forces the outputs of gates 632 and 634 to be 0 regardless of the value of the signals 622 and 624. Otherwise, the signal 630 is 1 to allow the signals 622 and 624 to pass through the gates 632 and 634 respectively.

Figure 7:
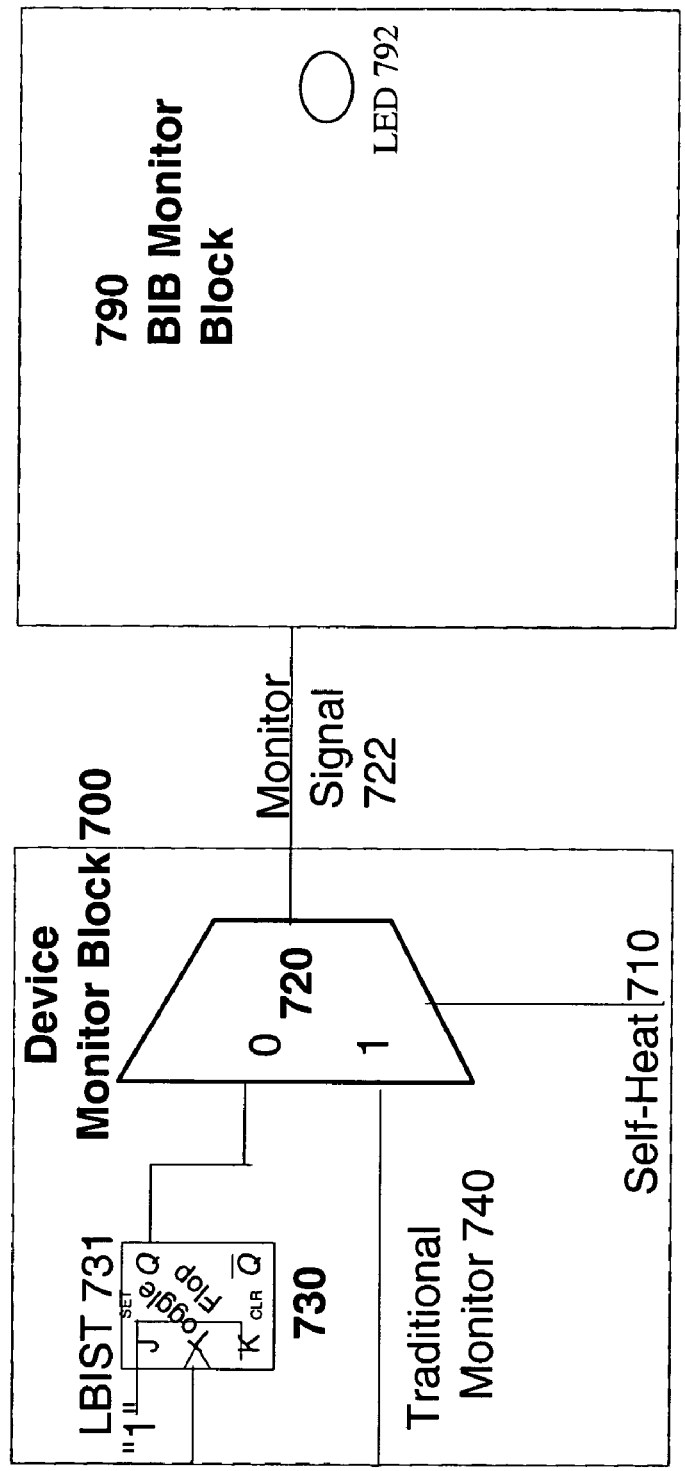
FIG. 7 shows one embodiment of a device monitoring block.

In one embodiment, the device includes a device monitor block as shown in FIG. 7. A signal 710 from the test mode logic (not shown) of the device is input to the multiplexer 720 in the device monitor block 700. The signal 710 indicates whether the device is in the self-heating burn-in mode. In one embodiment, a signal, LBIST 731, set at "1" is input to a toggle flip-flop 730. The output of the toggle flip flop 730 is input to the multiplexer 720 along with a signal 740 that indicates whether the traditional monitor is on. In response to the signal 710, the multiplexer 720 selects the output from the toggle flip-flop 730 when the device is in self-heating burn-in mode. In one embodiment, the monitor signal 722 drives a light emitting diode (LED) 792 on the BIB. In one embodiment, the LED 792 on the BIB lights up when LBIST is active. When LBIST is active again, the LED 792 goes dark. The toggle sequence continues during self-heating burn-in of the device. In one embodiment, the LED 792 on the BIB blinks between 1 to 2 hertz to indicate the device under stress is in self-heating burn-in. By observing the LED 792, operators on test floor can tell whether the devices are running self-heating burn-in.

Figure 8A:
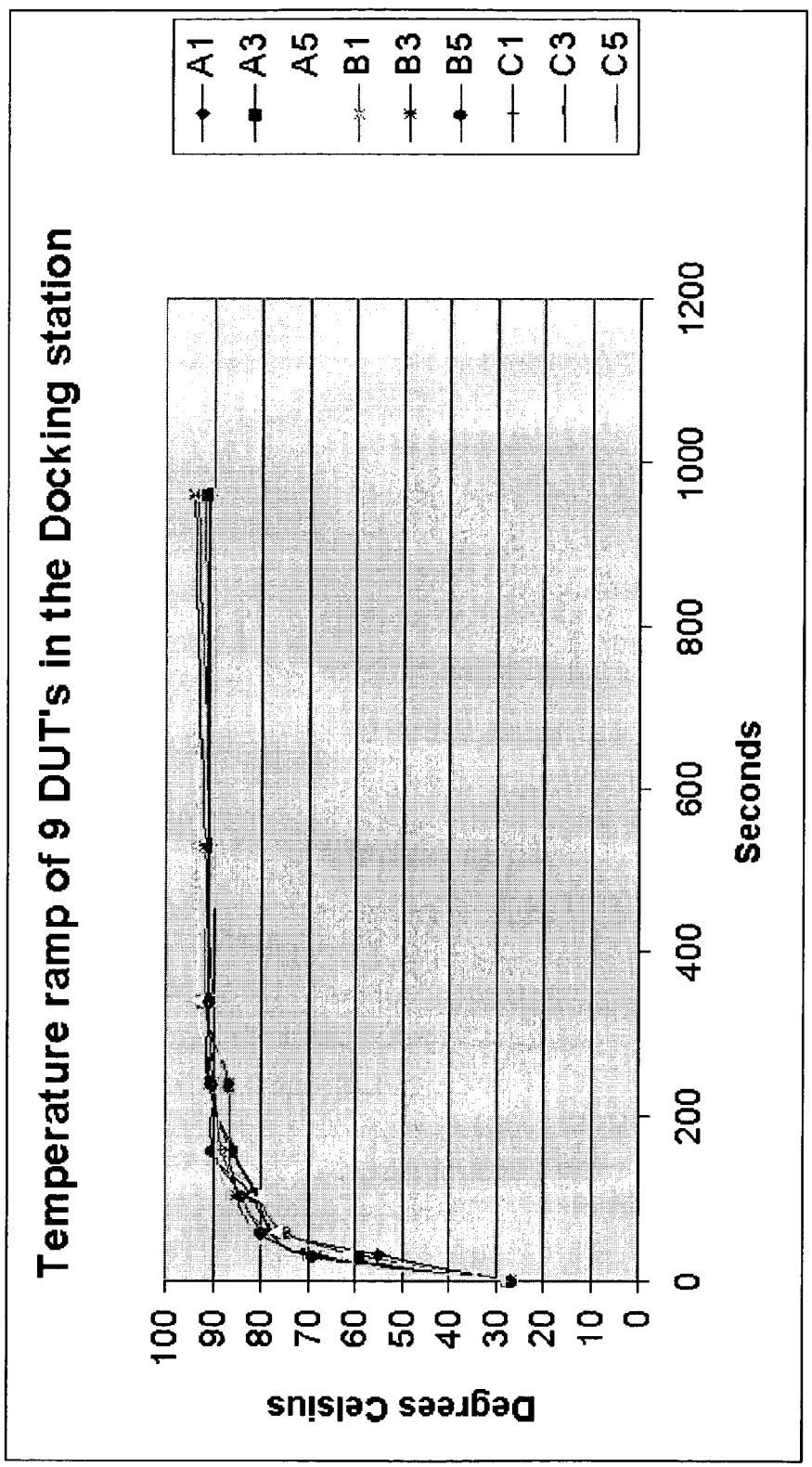
FIG. 8A shows the temperature ramp-up curve of 9 exemplary devices.
Figure 8B:
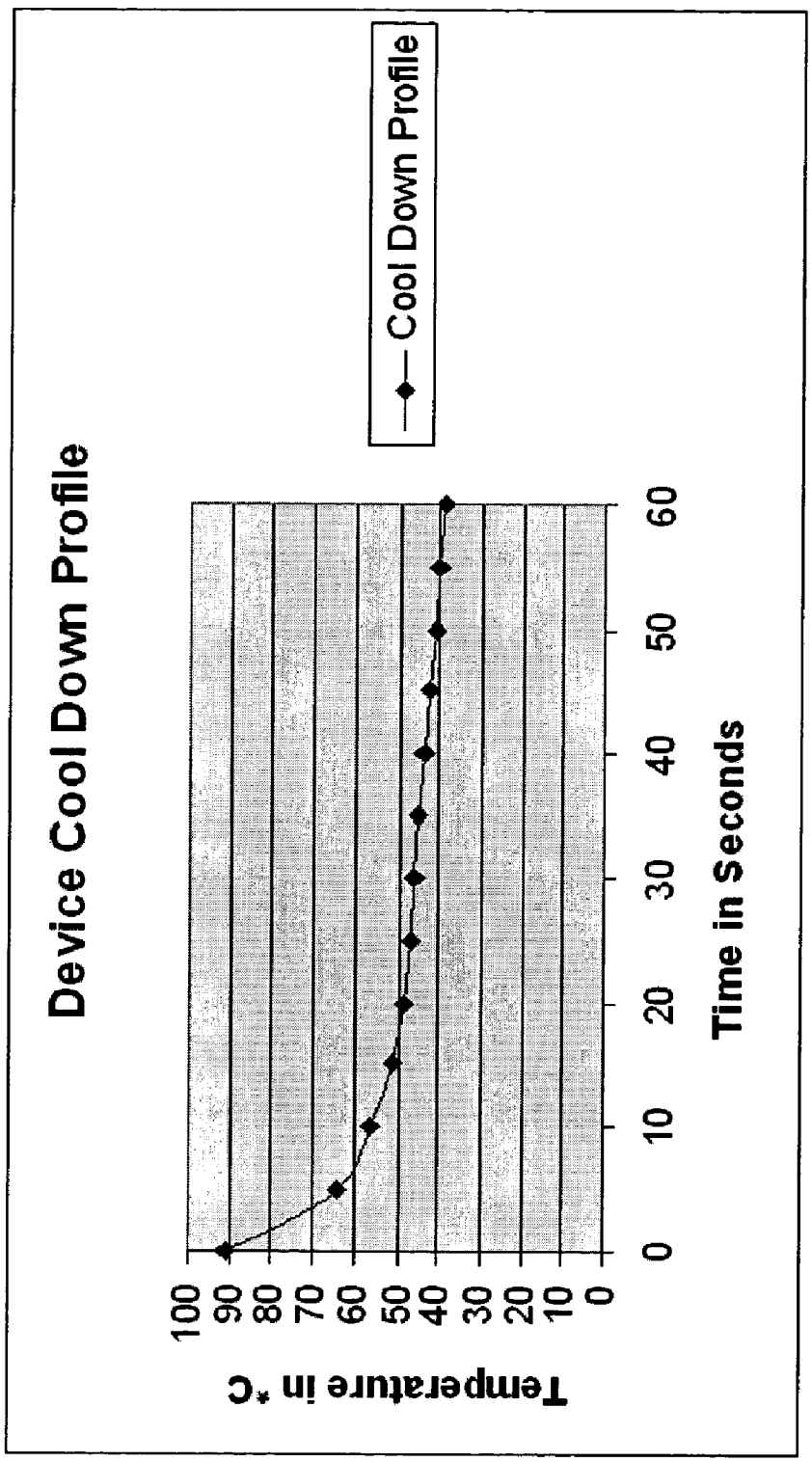
FIG. 8B shows the cool down profile of an exemplary device.

In one embodiment, the device is simply powered down after burn-in. When the device is powered down, the device stops running, and therefore, cools itself down. The temperature ramp up time and cool down time in self-heating burn-in are both shorter than the oven pre-heat time and the oven cool-down time. FIG. 8A and FIG. 8B show the temperature ramp up time and cool down time measured in exemplary devices respectively. Referring to FIG. 8A, the time for 9 exemplary devices to ramp up their temperature from room temperature to approximately 92° C. is roughly between 200 to 400 seconds. Comparing with the oven temperature ramp-up time of 25 minutes, significant test time saving is achieved using self-heating burn-in. Likewise, the device cool down time of self-heating burn-in is significantly shorter than the cool down time of the oven. FIG. 8B shows the cool down profile of an exemplary device. According to FIG. 8B, the exemplary device cools off from over 90° C. to below 65° C. in about 10 seconds. Once the device temperature is below 65° C., it is generally safe for operators to handle the device. In contrast, it takes approximately 25 minutes to cool down the oven. Therefore, self-heating burn-in saves time in cooling down the device as well.

Figure 8C:
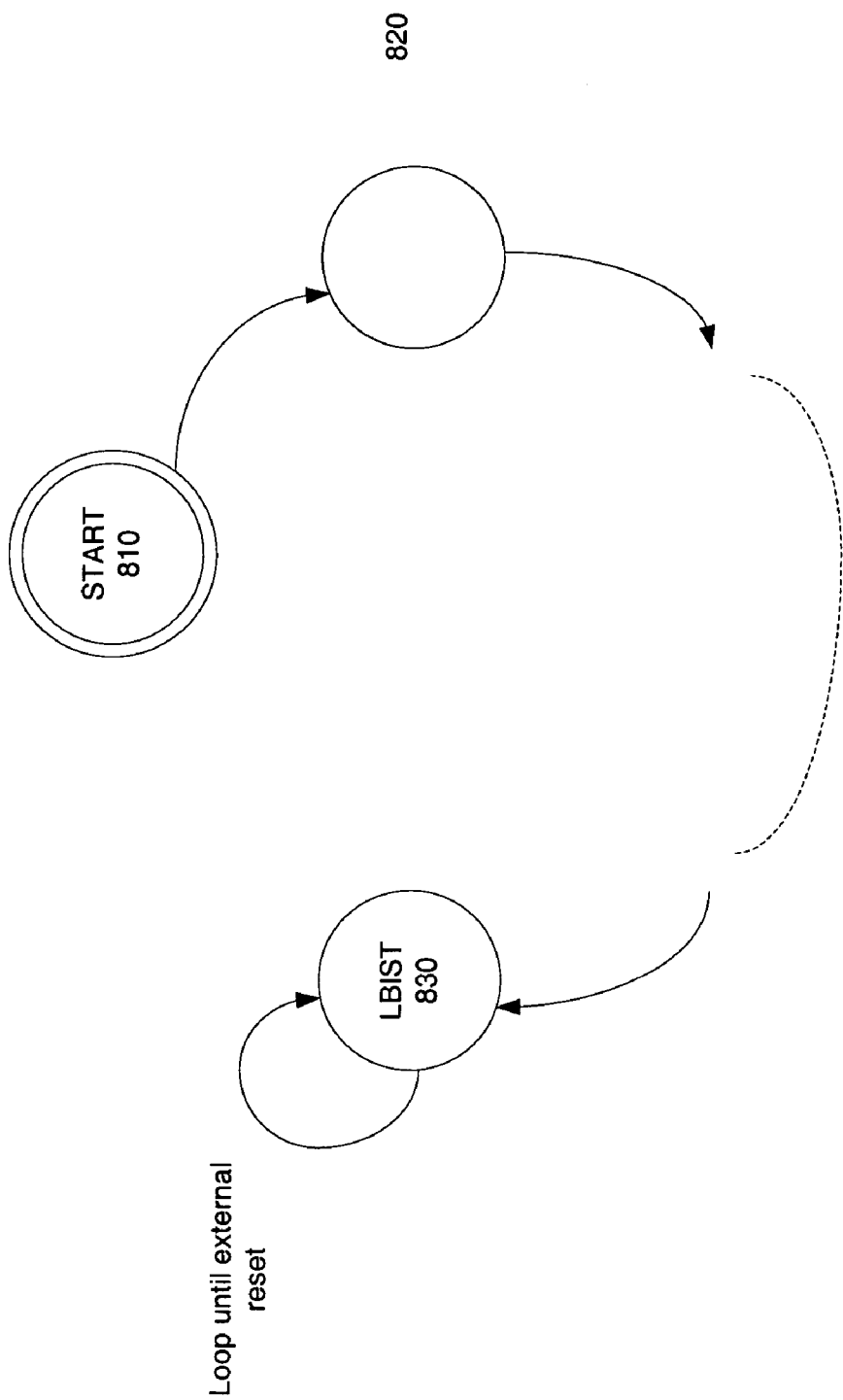
FIG. 8C shows the state diagram of one embodiment of a state machine.

FIG. 8C shows a state diagram of one embodiment of the state machine 407 in FIG. 4A. Upon receiving one or more input signals from a driver card to trigger self-heating burn-in, the state machine starts self-heating burn-in (state 810). In one embodiment, the state machine is activated by a strap signal from the BIB. The strap signal is generated by tying a pin on the BIB to a high or low voltage level from a power supply.

Referring to the state diagram in FIG. 8C, the state machine goes into one or more modes (states 820) and then into the logic built-in self test (LBIST) mode (state 830). Examples of the one or more modes include 13N mode, DAC mode, LCS mode, S2C mode, etc. One should appreciate that the modes listed above are for illustrative purpose only, and the state machine may enter into modes in addition to those listed above.

Once the state machine starts running the LBIST mode (state 830), the state machine loops in the LBIST mode until receiving a reset signal from the driver on the BIB. In one embodiment, a reset is generated by the driver card once every 208 milliseconds. The LBIST mode provides high toggle coverage in one embodiment, i.e., a large percentage of gates in the device are toggled during the LBIST mode. By toggling the gates, the device generates a significant amount of heat during execution of the LBIST mode.

Driver Card

Figure 9:
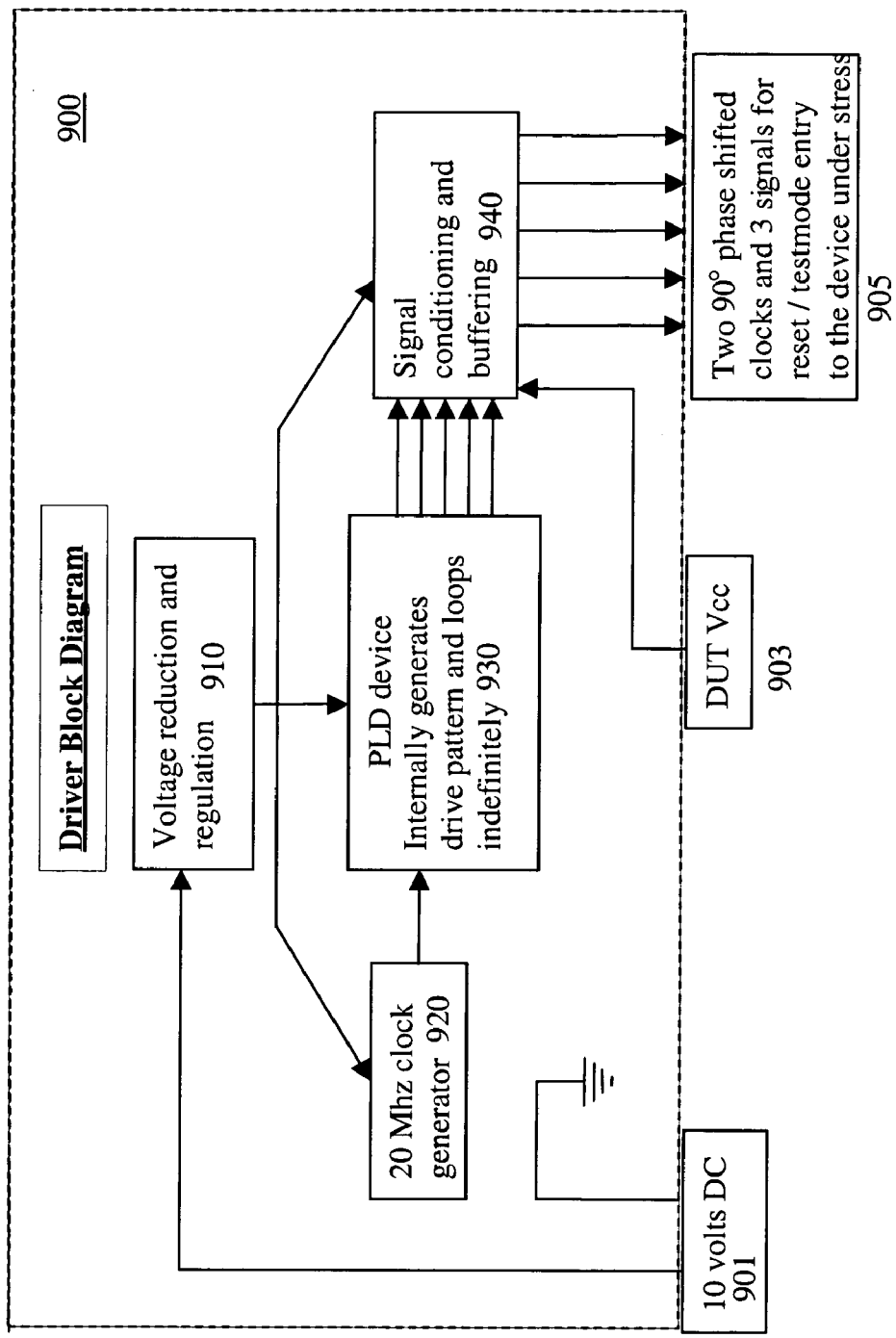
FIG. 9 shows one embodiment of a driver card.

In one embodiment, a driver card drives the device during burn-in. FIG. 9 shows an embodiment of a driver card 900. Referring to FIG. 9, the driver card 900 includes a programmable logic device (PLD) 930, a buffer 940, a clock generator 920, and a voltage regulator 910. The components of the driver card 900 are mounted on a printed circuit board. In one embodiment, the printed circuit board is 1"×2".

In one embodiment, an external voltage supply 901 is provided to the voltage regulator 910. The value of the external voltage supply 901 varies in different embodiments, depending on the type of devices undergoing burn-in, the burn-in time, the burn-in temperature, etc. In one embodiment, the external voltage supply 901 is 6.6V. The voltage regulator 910 regulates the voltage received and supplies the regulated voltage to the clock generator 920, the PLD 930, and the buffer 940. In one embodiment, the regulator 910 reduces the voltage received.

The clock generator 920 generates a clock signal and inputs the clock signal to the PLD 930. In one embodiment, the clock generator 920 includes a transistor-transistor logic (TTL) crystal can to generate a clock signal at 20 MHz. Using the clock signal, the PLD 930 generates a drive pattern to trigger the device to run self-heating burn-in. The PLD 930 continuously loops through the drive pattern indefinitely in one embodiment. The PLD 930 forwards the drive pattern via the buffer 940 to the device. In one embodiment, the drive pattern includes three signals to cause the device to enter the self-heating burn-in mode and to reset the device. One should appreciate that the PLD 930 may generate different number of signals in the drive pattern, such as, for example, 2, 4, or 5. In one embodiment, the PLD 930 generates two 90° phase shifted clock signals for the device.

In one embodiment, the PLD 930 forwards the signals generated via the buffer 940 to the device undergoing burn-in 905. In one embodiment, the buffer 940 includes a 74HCT244 buffer. In one embodiment, the voltage 903 that goes into the device undergoing burn-in powers the buffer 940. Using the same voltage 903 to enable the buffer 940 ensures the voltage supply of the device undergoing burn-in and the driver patterns to ramp up together.

Figure 10:
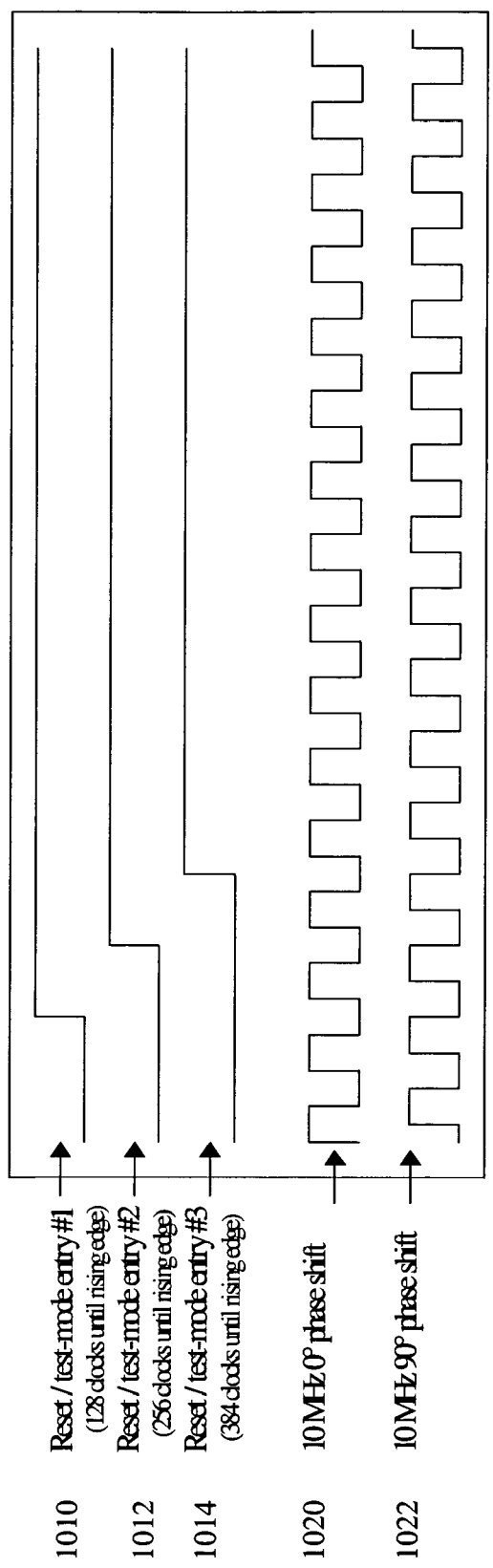
FIG. 10 shows sample signals from an embodiment of a driver card.

A sample burn-in pattern and the two phase shifted clock signals generated by one embodiment of the driver card are shown in FIG. 10. Signals 1010-1014 work together to reset and/or to cause the device to enter into the self-heating burn-in mode. Clock signals 1020 and 1022 are 10 MHz clock signals with 90° phase shift relative to each other.

Figure 11:
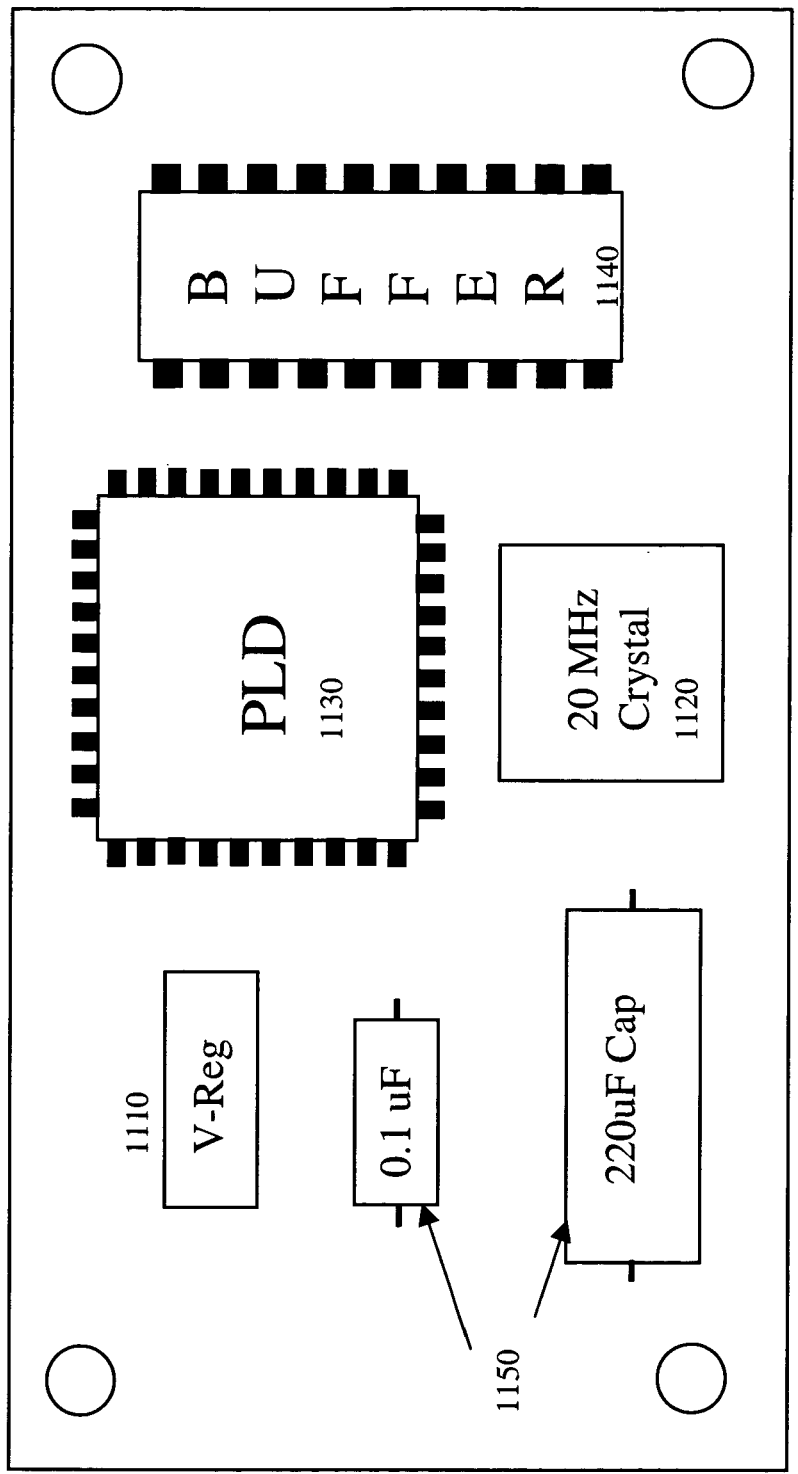
FIG. 11 shows one embodiment of a driver card.

FIG. 11 shows the top view of one embodiment of the driver card 1100. It should be apparent that the layout of individual components on the driver card varies among different embodiments. Furthermore, one or more of the components may also be placed on the bottom of the driver card to reduce the size of the driver card. Referring to FIG. 11, the driver card includes a voltage regulator 1110, a 20 MHz crystal can 1120, a PLD 1130, a buffer 1140, and a number of capacitors 1150.

In one embodiment, one driver card is mounted on each BIB. In an alternate embodiment, multiple driver cards are mounted on each BIB. A driver card may drive different numbers of devices in various embodiments.

The driver card is a low cost replacement for traditional burn-in drivers, which were located behind an oven firewall and communicated with the devices undergoing burn-in through an edge connector. Unlike a traditional driver, which needs custom programming for every product, the new driver card is not product specific in one embodiment because the same signals in the same sequence can trigger any device having the on-die DFT Moreover, another cost advantage of the driver card is the reduction of channels on the driver. The traditional driver requires as many as 64 channels, while one embodiment of the new driver card has only 5 channels. Another advantage realized by the new driver card is the reduction in test time. One embodiment of the new driver card will immediately begin generating the burn-in pattern upon power-up. It is not necessary to load a pattern to the driver card, unlike the traditional burn-in drivers, which could take 20-25 minutes to load a pattern.

An Exemplary Embodiment of a Computer System

Figure 12:
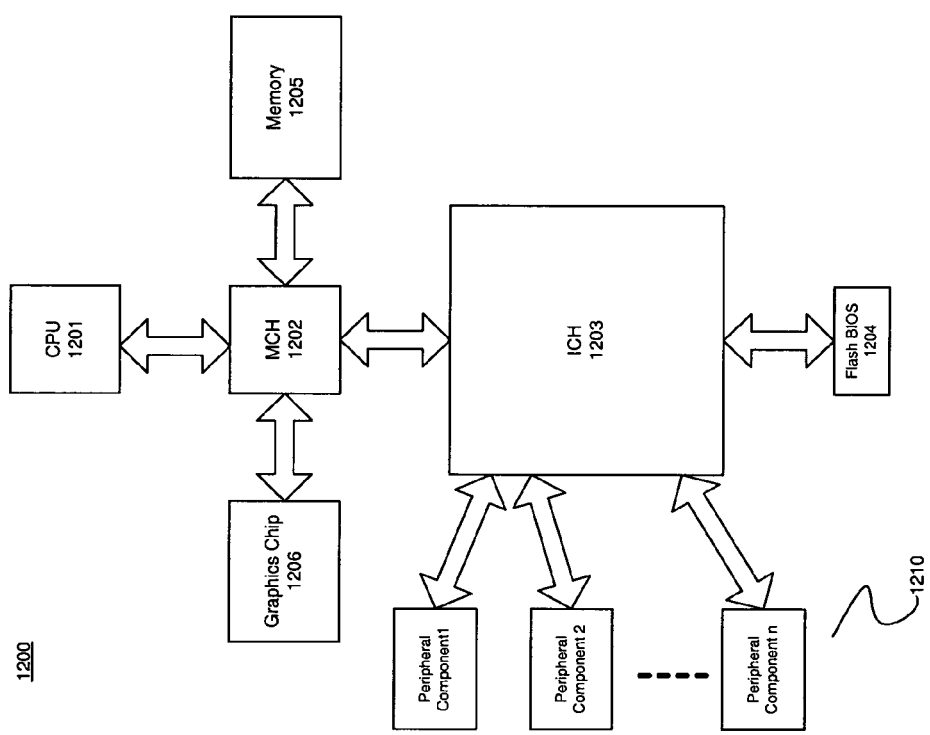
FIG. 12 shows an exemplary embodiment of a computer system.

In one embodiment, a device with on-die DFT is part of a chipset incorporated in a computer system. The chipset may include a memory controller hub (MCH), an input/output controller hub (ICH), a graphics chip, etc. FIG. 12 shows an exemplary embodiment of a computer system. The system 1200 includes a central processing unit (CPU) 1201, a MCH 1202, an ICH 1203, a flash memory device storing the Basic Input Output System (Flash BIOS) 1204, a memory device 1205, a graphics chip 1206, and a number of peripheral components 1210. The CPU 1201, the memory device 1205, the graphics chip 1206, and the ICH 1203 are coupled to the MCH 1202. Data sent and received between the CPU 1201, the memory device 1205, the graphics chip 1206, and the ICH 1203 are routed through the MCH 1202. The peripheral components 1210 and the flash BIOS 1204 are coupled to the ICH 1203. The peripheral components 1210 and the flash BIOS 1204 communicate with the CPU 1201, the graphics chip 1206, and the memory 1205 through the ICH 1203 and the MCH 1202. Note that any or all of the components of system 1200 and associated hardware may be used in various embodiments of the present invention. However, it can be appreciated that other embodiments of the computer system may include some or all of the devices.

The foregoing discussion merely describes some exemplary embodiments of the present invention. One skilled in the art will readily recognize from such discussion, the accompanying drawings and the claims that various modifications can be made without departing from the spirit and scope of the appended claims. The description is thus to be regarded as illustrative instead of limiting.

What is claimed is:

1. A semiconductor device comprising:
    core logic;
    clock generation circuitry coupled with the core logic, the clock generation circuitry including a multiplexer to select one of a plurality of clock signals to clock the core logic, wherein the selected clock signal is provided to the core logic and the core logic generates heat for self-heating burn-in responsive, at least in part, to the selected clock signal; and
    a thermal sensing circuitry to monitor an internal temperature of the semiconductor device, wherein the internal temperature is based at least in part, on the heat generated by the core logic responsive to the selected clock signal.

2. The semiconductor device of claim 1, wherein the thermal sensing circuitry generates a signal in response to the internal temperature and the multiplexer selects the clock signal in response to the signal.

3. The semiconductor device of claim 1, wherein the thermal sensing circuitry comprises:
    a thermal sensor; and
    one or more fuses, being programmable based on temperature level, coupled to the thermal sensor and programmed to one or more temperature levels.

4. The semiconductor device of claim 1 further comprising a state machine to execute a plurality of test modes during bum-in.

* * * * *